(12) United States Patent
Kim et al.

(10) Patent No.: US 10,984,869 B2
(45) Date of Patent: Apr. 20, 2021

(54) MEMORY DEVICE, MEMORY SYSTEM INCLUDING THE MEMORY DEVICE, AND OPERATING METHOD OF THE MEMORY SYSTEM

(71) Applicant: SK hynix Inc., Icheon-si (KR)

(72) Inventors: Sung Ho Kim, Cheongju-si (KR); Jong Han Ahn, Yangju-si (KR); Seong Cheon Yu, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/667,782

(22) Filed: Oct. 29, 2019

(65) Prior Publication Data
US 2020/0381054 A1 Dec. 3, 2020

(30) Foreign Application Priority Data
May 28, 2019 (KR) .......................... 10-2019-0062731

(51) Int. Cl.
*G11C 16/10* (2006.01)
*G11C 16/04* (2006.01)

(52) U.S. Cl.
CPC .............. *G11C 16/10* (2013.01); *G11C 16/04* (2013.01)

(58) Field of Classification Search
CPC .................................. G11C 16/10; G11C 16/04

USPC .................................................. 365/185.12
See application file for complete search history.

(56) References Cited

U.S. PATENT DOCUMENTS

| 10,074,439 | B2 * | 9/2018 | Li | ............................ G11C 7/02 |
| 2018/0277237 | A1 * | 9/2018 | Maeda | ................... G11C 29/52 |
| 2019/0172544 | A1 * | 6/2019 | Kim | ..................... G11C 11/5671 |
| 2020/0183782 | A1 * | 6/2020 | Nakai | ............... H03M 13/6575 |
| 2020/0202927 | A1 * | 6/2020 | Lee | ....................... G11C 11/5628 |
| 2020/0211652 | A1 * | 7/2020 | Wu | ....................... G06F 12/0246 |
| 2020/0233745 | A1 * | 7/2020 | Yang | ................... G06F 11/1076 |

FOREIGN PATENT DOCUMENTS

| KR | 1020170024429 A | 3/2017 |
| KR | 1020170101000 A | 9/2017 |

* cited by examiner

*Primary Examiner* — Fernando Hidalgo
(74) *Attorney, Agent, or Firm* — William Park & Associates Ltd.

(57) ABSTRACT

A memory device includes: a memory block including a plurality of main pages and a dummy page; a peripheral circuit for performing a normal program operation on the plurality of main pages and a dummy program operation on the dummy page in a program operation, and reading data stored in the dummy page and the plurality of main pages in a read operation; and control logic for controlling the peripheral circuit to program, to the dummy page, the same data as first logical page data of a first main page among the plurality of main pages in the program operation.

15 Claims, 10 Drawing Sheets

MEMORY DEVICE, MEMORY SYSTEM INCLUDING THE MEMORY DEVICE, AND OPERATING METHOD OF THE MEMORY SYSTEM

CROSS-REFERENCE TO RELATED APPLICATION

The present application claims priority under 35 U.S.C. § 119(a) to Korean patent application number 10-2019-0062731, filed on May 28, 2019, in the Korean Intellectual Property Office, the entire disclosure of which is incorporated herein by reference.

BACKGROUND

1. Technical Field

The present disclosure generally relates to an electronic device, and more particularly, to a memory device, a memory system including the memory device, and an operating method of the memory system.

2. Related Art

The paradigm on recent computer environments has been turned into ubiquitous computing environments in which computing systems can be used anywhere and anytime. This promotes increasing usage of portable electronic devices such as mobile phones, digital cameras, notebook computers, and the like. Such portable electronic devices may generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In an example of memory systems having such advantages, the data storage device includes a Universal Serial Bus (USB) memory device, memory cards having various interfaces, a Solid State Drive (SSD), and the like.

SUMMARY

In accordance with an aspect of the present disclosure, there may be provided a memory device including: a memory block including a plurality of main pages and a dummy page; a peripheral circuit configured to perform a normal program operation on the plurality of main pages and a dummy program operation on the dummy page in a program operation, and read data stored in the dummy page and the plurality of main pages in a read operation; and control logic configured to control the peripheral circuit to program, to the dummy page, the same data as first logical page data of a first main page among the plurality of main pages in the program operation.

In accordance with another aspect of the present disclosure, there may be provided a memory system including: a memory device configured to include a plurality of memory blocks each including a plurality of main pages and a dummy page and a peripheral circuit for a program operation and a read operation on a selected memory block among the plurality of memory blocks; and a controller configured to control the memory device to perform the program operation and the read operation in response to a request received from a host, and control the memory device to perform a dummy read operation on the dummy page and a normal read operation on the plurality of main pages in a first read operation of the selected memory block.

In accordance with still another aspect of the present disclosure, there may be provided a method for operating a memory system, the method including: providing a memory block including a plurality of main pages and a dummy page; performing a dummy program operation of programming, to the dummy page, first logical page data to be programmed to a first main page among the plurality of main pages; and performing a normal program operation of programming first logical page data to an nth logical page data (n is a positive number of 2 or more) to each of the plurality of main pages.

BRIEF DESCRIPTION OF THE DRAWINGS

Various embodiments will now be with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
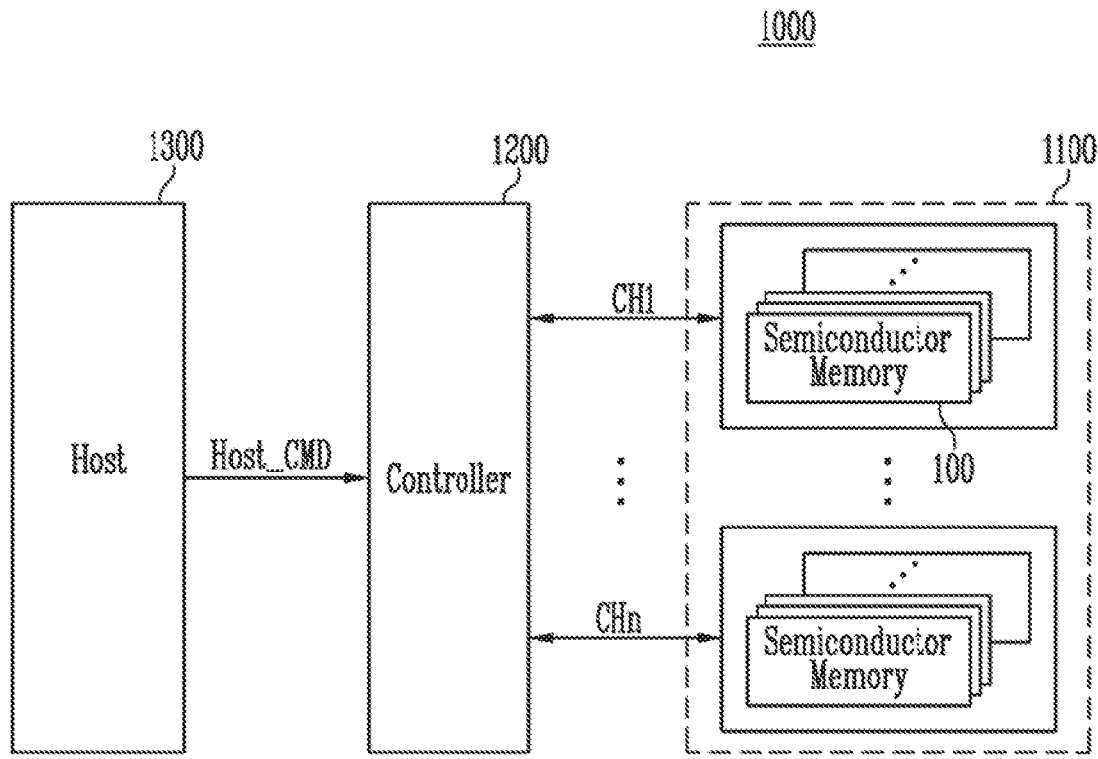
FIG. 1 is a block diagram illustrating a memory system in accordance with an embodiment of the present disclosure.

The structural or functional descriptions disclosed herein are merely illustrative for the purpose of describing embodiments according to the concepts of the present disclosure. The embodiments according to the concepts of the present disclosure can be implemented in various forms, and cannot be construed as limited to the embodiments set forth herein.

The embodiments according to the concepts of the present disclosure can be variously modified and have various shapes. Thus, the embodiments are illustrated in the drawings and are intended to be described herein. However, the embodiments according to the concepts of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, examples of embodiments of the present disclosure will be described with reference to the accompanying drawings in order for those skilled in the art to be able to readily implement the technical spirit of the present disclosure.

Embodiments may provide a memory device having improved read reliability, a memory system including the memory device, and a method of operating the memory system device.

FIG. 1 is a block diagram illustrating a memory system in accordance with an embodiment of the present disclosure.

Referring to FIG. 1, the memory system 1000 may include a memory device 1100, a controller 1200, and a host 1300. The memory device 1100 includes a plurality of semiconductor memories 100. The plurality of semiconductor memories 100 may be divided into a plurality of groups.

Although a case where the host 1300 is included in the memory system 1000 is illustrated and described in an embodiment of the present disclosure, the memory system 1000 may include only the controller 1200 and the memory device 1100, and the host 1300 may be disposed at the outside of the memory system 1000.

In FIG. 1, a case where the plurality of groups of the memory device 1100 communicate with the controller 1200 respectively through first to nth channels CH1 to CHn is illustrated. Each semiconductor memory 100 will be described later with reference to FIG. 3.

Each of the plurality of groups configured with the semiconductor memories 100 communicates with the controller 1200 through one common channel. The controller 1200 controls the plurality of semiconductor memories 100 of the memory device 1100 through the plurality of channels CH to CHn. Each of the plurality of memories 100 may include a plurality of memory blocks, and each of the plurality of memory blocks may be configured with a dummy page and a plurality of main pages. A configuration of the memory block will be described with reference to FIGS. 4 to 6, which will be described later.

The controller 1200 is coupled between the host 1300 and the memory device 1100. The controller 1200 accesses the memory device 1100 in response to a request from the host 1300. For example, the controller 1200 controls read, program, erase, and background operations of the memory device 1100 in response to a host command Host_CMD received from the host 1300. In the program operation, the host 1300 may transmit data and an address together with the host command Host_CMD. In the read operation, the host 1300 may transmit an address together with the host command Host_CMD. The controller 1200 provides an interface between the memory device 1100 and the host 1300. The controller 1200 drives firmware for controlling the memory device 1100.

In a program operation, the controller 1200 may control the memory device 1100 to program set data to a dummy page of a memory block included in the semiconductor memory 100. Also, in the case of a first read operation of a selected memory block in a read operation, the controller 1200 may control the memory device 1100 to perform a read operation on a dummy page and then perform a read operation on main pages.

The channel potential level of a memory block of which program operation is completed may increase since a hole is generated in a channel or a leakage current is introduced into the channel, due to a program operation, etc. of another memory block sharing word lines with the memory block. In an embodiment of the present disclosure, the channel potential level of a selected memory block is stabilized by a read operation on a dummy page, and a read operation on main pages is then performed, so that the reliability of the read operation can be improved.

The host 1300 includes portable electronic devices such as a computer, a PDA, a PMP, an MP3 player, a camera, a camcorder, and a mobile phone. The host 1300 may request a program operation, a read operation, an erase operation, etc. of the memory system 1000 through a host command Host_CMD. In order to perform a program operation of the memory device 1100, the host 1300 may transmit, to the controller 1200, a host command Host_CMD, data, and an address, which correspond to a write command. In order to perform a read operation of the memory device 1100, the host 1300 may transmit, to the controller 1200, a host command Host_CMD and an address, which correspond to a read command. The address may be a logical address.

The controller 1200 and the memory device 1100 may be integrated into one semiconductor device. In an embodiment, the controller 1200 and the memory device 1100 may be integrated into one semiconductor device, to constitute a memory card. For example, the controller 1200 and the memory device 1100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD card (SD, miniSD, microSD or SDHC), or a Universal Flash Storage (UFS).

The controller 1200 and the memory device 1100 may be integrated into one semiconductor device to constitute a semiconductor drive (Solid State Drive (SSD)). The semiconductor drive SSD includes a storage device configured to store data in a semiconductor memory.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the memory device 1100 or the memory system 1000 may be packaged in various forms. For example, the memory device 1100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Figure 2:
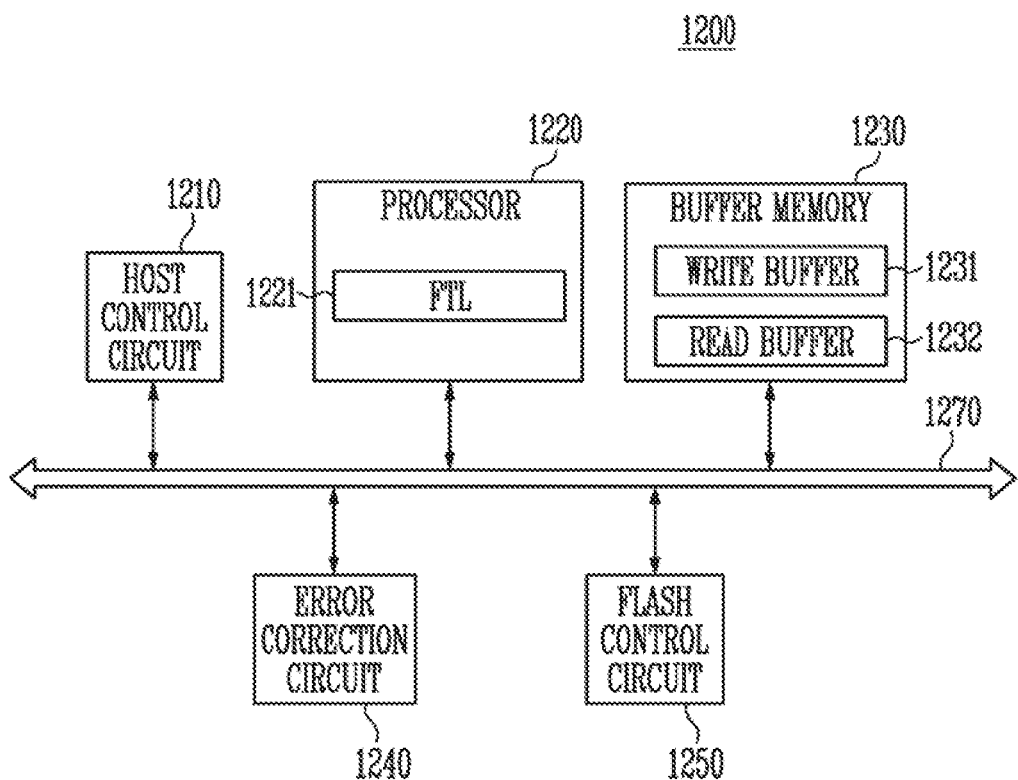
FIG. 2 is a block diagram illustrating a configuration of a controller shown in FIG. 1.

FIG. 2 is a block diagram illustrating a configuration of the controller shown in FIG. 1.

Referring to FIG. 2, the controller 1200 may include a host control circuit 1210, a processor 1220, a buffer memory 1230, an error correction circuit 1240, a flash control circuit 1250, and a bus 1270.

The bus 1270 may provide a channel between components of the controller 1200.

The host control circuit 1210 may control data transmission between the host 1300 shown in FIG. 1 and the buffer memory 1230. In an example, the host control circuit 1210 may control an operation of buffering data input from the host 1300 to the buffer memory 1230. In another example, the host control circuit 1210 may control an operation of outputting the data buffered to the buffer memory 1230 to the host 1300.

The host control circuit 1210 may include a host interface.

The processor 1220 may control the overall operations of the controller 1200, and perform a logical operation. The processor 1220 may communicate with the host 1300 shown in FIG. 1 through the host control circuit 1210, and communicate with the memory device 1100 shown in FIG. 1 through the flash control circuit 1250. Also, the processor 1220 may control an operation of the memory system 1000 by using the buffer memory 1230 as a working memory, cache memory or buffer memory. The processor 1220 may control the flash control circuit 1250 by generating a command queue by realigning a plurality of host commands received from the host 1300 according to an order of priority. The processor 1220 may include a Flash Translation Layer (hereinafter, referred to as 'FTL') 1221. The processor 1220 may control the buffer memory 1230 and the flash control circuit 1250 so as to control the memory device 1100 to program, to a dummy page, first logical page data among a plurality of logical page data to be programmed to a first physical page of a selected memory block in a program operation. Also, the processor 1220 may control the flash control circuit 1250 to read data stored in the dummy page in a first read operation of the selected memory block, and determine a read operation method of main pages, based on whether read data is valid. For example, when it is determined that data read from the dummy page is valid, the processor 1220 may control the flash control circuit 1250 to perform only a read operation of the other logical page data except the first logical page data in a read operation on the first physical page. On the other hand, when it is determined that the data read from the dummy page is not valid, the processor 1220 may control the flash control circuit 1250 to perform a read operation on all logical pages of the first physical page.

The Flash Translation Layer (FTL) 1221 controls the memory device 1100 by driving firmware. The firmware may be stored in an additional memory (not shown) directly coupled to the buffer memory 1230 or a storage space in the processor 1220. The FTL 1221 may map a corresponding physical address to an address (e.g., a logical address) input from the host 1300 shown in FIG. 1 in a program operation. Also, the FTL 1221 checks the physical address mapped to the logical address input from the host 1300 in a read operation.

Also, the FTL 1221 may generate a command queue for controlling the flash control circuit 1250 in response to a host command received from the host 1300.

The buffer memory 1230 may be used as a working memory, cache memory or buffer of the processor 1220. The buffer memory 1230 may store codes and commands, which are executed by the processor 1220. The buffer memory 1230 may store data processed by the processor 1220.

The buffer memory 1230 may include a write buffer 1231 and a read buffer 1232. The write buffer 1231 temporarily stores data received from the host 1300 in a program operation and then transmits the temporarily stored data to the memory device 1100 when an internal command corresponding to the write operation is transmitted to the memory device 1100. The read buffer 1232 temporarily stores data received from the memory device 1100 in a read operation and then transmits the temporarily stored data to the host 1300.

The buffer memory 1230 may include a Static Random Access Memory (RAM) (SRAM) or Dynamic RAM (DRAM).

The error correction circuit 1250 may perform an error correction operation. The error correction circuit 1250 may perform Error Correcting Code (ECC) encoding, based on data to be written to the memory device 1100 shown in FIG. 1 through the flash control circuit 1250. The ECC-encoded data may be transferred to the memory device 1100 through the flash control circuit 1250. The error correction circuit 1240 may perform ECC decoding on data received from the memory device 1100 through the flash control circuit 1250. The error correction circuit 1240 may be configured with one of a plurality of ECC circuits, and the plurality of ECC circuits may have difference error correction capabilities. That is, the plurality of ECC circuits have different maximum allow error bit numbers. Also, the error correction circuit 1240 may determine whether data received from the memory device 1100 in a read operation is valid. For example, the error correction circuit 1240 may detect and count a number of error bits included in data received from the memory device 1100, determine that the corresponding data is valid when the counted number of error bits is equal to or smaller than a maximum allow error bit number of the error correction circuit 1240, and determine that the corresponding data is not valid when the counted number of error bits is greater than the maximum allow error bit number of the error correction circuit 1240.

In an example, the error correction circuit 1240 may be included as a component of the flash control circuit 1250 in the flash control circuit 1250.

The flash control circuit 1250 generates and outputs an internal command for controlling the memory device 1100 in response to the command queue generated by the processor 1220. The flash control circuit 1250 may control a program operation by transmitting data buffered to the write buffer 1231 of the buffer memory 1230 to the memory device 1100 in the program operation. In another example, the flash control circuit 1250 may control an operation of buffering data read from the memory device 1100 to the read buffer 1232 of the buffer memory 1230 in response to the command queue in a read operation. Also, the flash control circuit 1250 may control the memory device 1100 to program, to a dummy page, first logical page data among a plurality of logical page data to be programmed to a first physical page of a selected memory block in a program operation under the control of the processor 1220. Also, the flash control circuit 1250 may control the memory device 1100 to read data stored in the dummy page in a first read operation of the selected memory block under the control of the processor 1220. Also, the flash control circuit 1250 may control the memory device 1100 to perform only a read operation of the other logical page data except the first logical page data or control the memory device 1100 to perform a read operation on all logical pages of the first physical page, in a read operation on the first physical page of the selected memory block under the control of the processor 1220.

The flash control circuit 1250 may include a flash interface.

Figure 3:
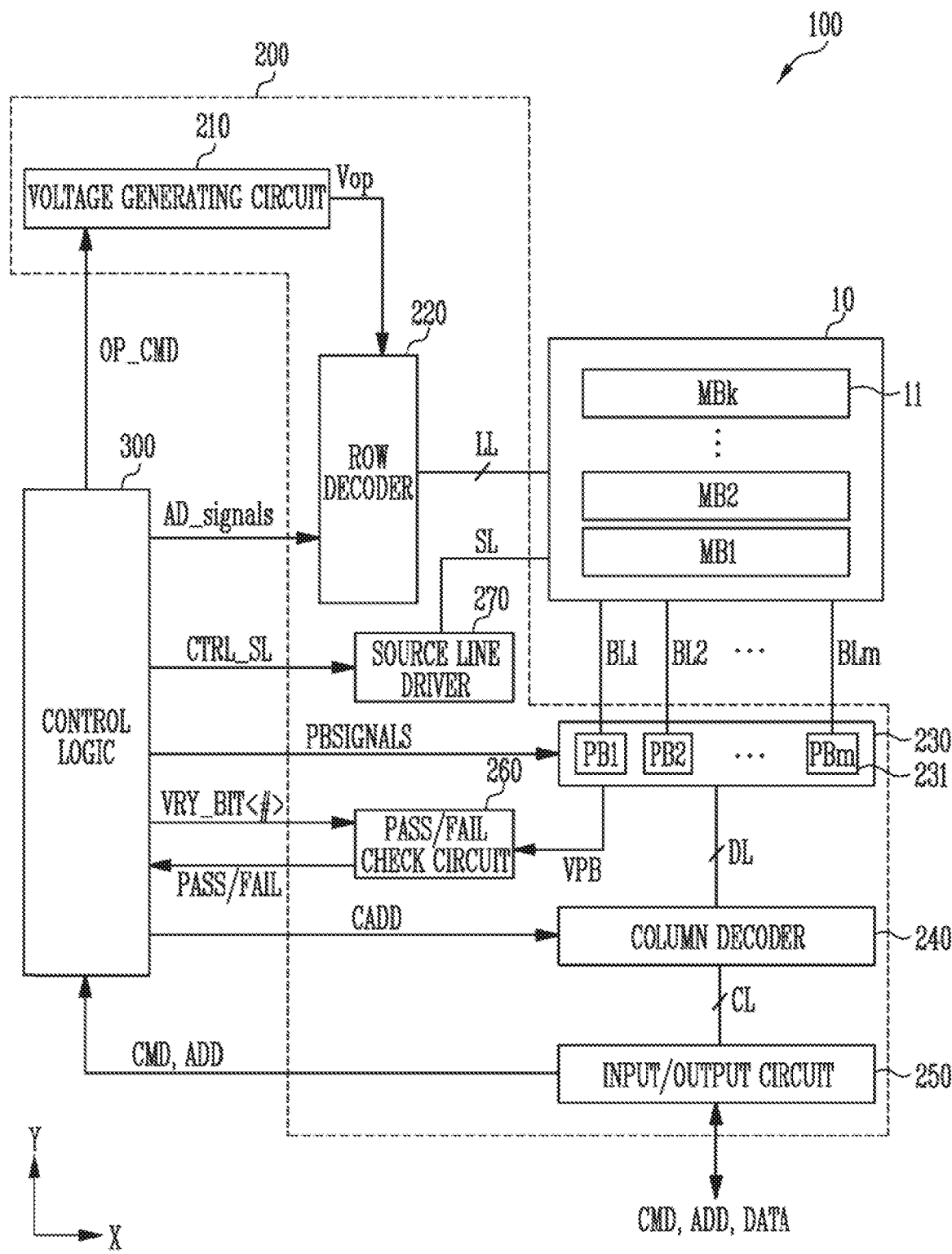
FIG. 3 is a diagram illustrating a semiconductor memory shown in FIG. 1.

FIG. 3 is a diagram illustrating the semiconductor memory 100 shown in FIG. 1.

Referring to FIG. 3, the semiconductor memory 100 may include a memory cell array 10 that stores data. The semiconductor memory 100 may include peripheral circuits 200 configured to perform a program operation for storing data in the memory cell array 10, a read operation for outputting the stored data, and an erase operation for erasing the stored data. The semiconductor memory 100 may include control logic 300 that controls the peripheral circuits 200 under the control of the controller 1200 shown in FIG. 1. The control logic 300 may be implemented as hardware, software, or a combination of hardware and software. For example, the control logic 300 may be a control logic circuit operating in accordance with an algorithm and/or a processor executing control logic code.

The memory cell array 10 may include memory blocks MB1 to MBk (k is a positive integer) 11. Local lines LL and bit lines BL1 to BLm (m is a positive integer) may be coupled to the memory blocks MB1 to MBk 11. For example, the local lines LL may include a first select line, a second select line, and a plurality of word lines arranged between the first and second select lines. Also, the local lines LL may further include dummy lines arranged between the first select line and the word lines and between the second select line and the word lines. The first select line may be a source select line, and the second select line may be a drain select line. For example, the local lines LL may include word lines, dummy word lines, drain and source select lines, and source lines SL. For example, the local lines LL may further include pipe lines. The local lines LL may be coupled to the memory blocks MB1 to MBk 11, respectively, and the bit lines BL1 to BLm may be commonly coupled to the memory blocks MB1 to MBk 11. The memory blocks MB1 to MBk 11 may be implemented in a two-dimensional or three-dimensional structure. For example, memory cells may be arranged in a direction parallel to a substrate in memory blocks 11 having a two-dimensional structure. For example, memory cells may be arranged in a direction vertical to a substrate in memory blocks 11 having a three-dimensional structure.

The peripheral circuits 200 may be configured to perform program, read, and erase operations of a selected memory block 11 under the control of the control logic 300. For example, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a read voltage, a verify voltage, a pass voltage, and a select transistor operation voltage under the control of the control logic 300.

The row decoder 220 may transfer the operating voltages Vop to local lines LL coupled to the selected memory block 11 in response to control signals AD_signals. For example, the row decoder 220 may selectively apply operation voltages (e.g., a program voltage, a read voltage, a verify voltage, a pass voltage, and the like) generated by the voltage generating circuit 210 to word lines among the local lines LL in response to the control signals AD_signals.

In a program voltage applying operation, the row decoder 220 applies a program voltage generated by the voltage generating circuit 210 to a selected word line among the local lines LL in the control signals AD_signals, and applies a pass voltage generated by the voltage generating circuit 210 to the other unselected word lines. Also, in a read operation, the row decoder 220 applies a read voltage generated by the voltage generating circuit 210 to a selected word line among the logical lines LL in response to the control signals AD_signals, and applies a pass voltage generated by the voltage generating circuit 210 to the other unselected word lines.

The page buffer group 230 may include a plurality of page buffers PB1 to PBm 231 coupled to the bit lines BL1 to BLm. The page buffers PB1 to PBm 231 may operate in response to page buffer control signals PBSIGNALS. For example, the page buffers PB1 to PBm 231 may temporarily store data to be programmed in a program operation, or sense voltages or currents of the bit lines BL1 to BLm in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the controller 1200 shown in FIG. 1, to the control logic 300, or exchange data DATA with the column decoder 240.

In a read operation, the pass/fail check circuit 260 may generate a reference current in response to an allow bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 10 through a source line SL, and control a voltage applied to the source line SL. The source line driver 270 may receive a source line control signal CTRL_SL from the control logic 300, and control a source line voltage applied to the source line SL, based on the source line control signal CTRL_SL.

The control logic 300 may control the peripheral circuits 200 by outputting the operation signal OP_CMD, the control signals AD_signals, the page buffer control signals PBSIGNALS, and the allow bit VRY_BIT<#> in response to the command CMD and the address ADD. Also, the control logic 300 may determine whether the verify operation has passed or failed in response to the pass or fail signal PASS or FAIL. Also, in a program operation, the control logic 300 may control the peripheral circuits 200 to perform the program operation on a dummy page of a selected memory block 11 in response to an internal command CMD and data DATA, which are received from the controller 1200 shown in FIG. 1. Also, in a read operation, the control logic 300 may control the peripheral circuits 200 to perform the read operation on a dummy page of a selected memory block 11 in response to an internal command CMD received from the controller 1200 shown in FIG. 1. Subsequently, the control logic 300 may control the peripheral circuit 200 to perform the read operation on main pages of the selected memory block 11 in response to an internal command CMD received from the controller 1200 shown in FIG. 1.

Figure 4:
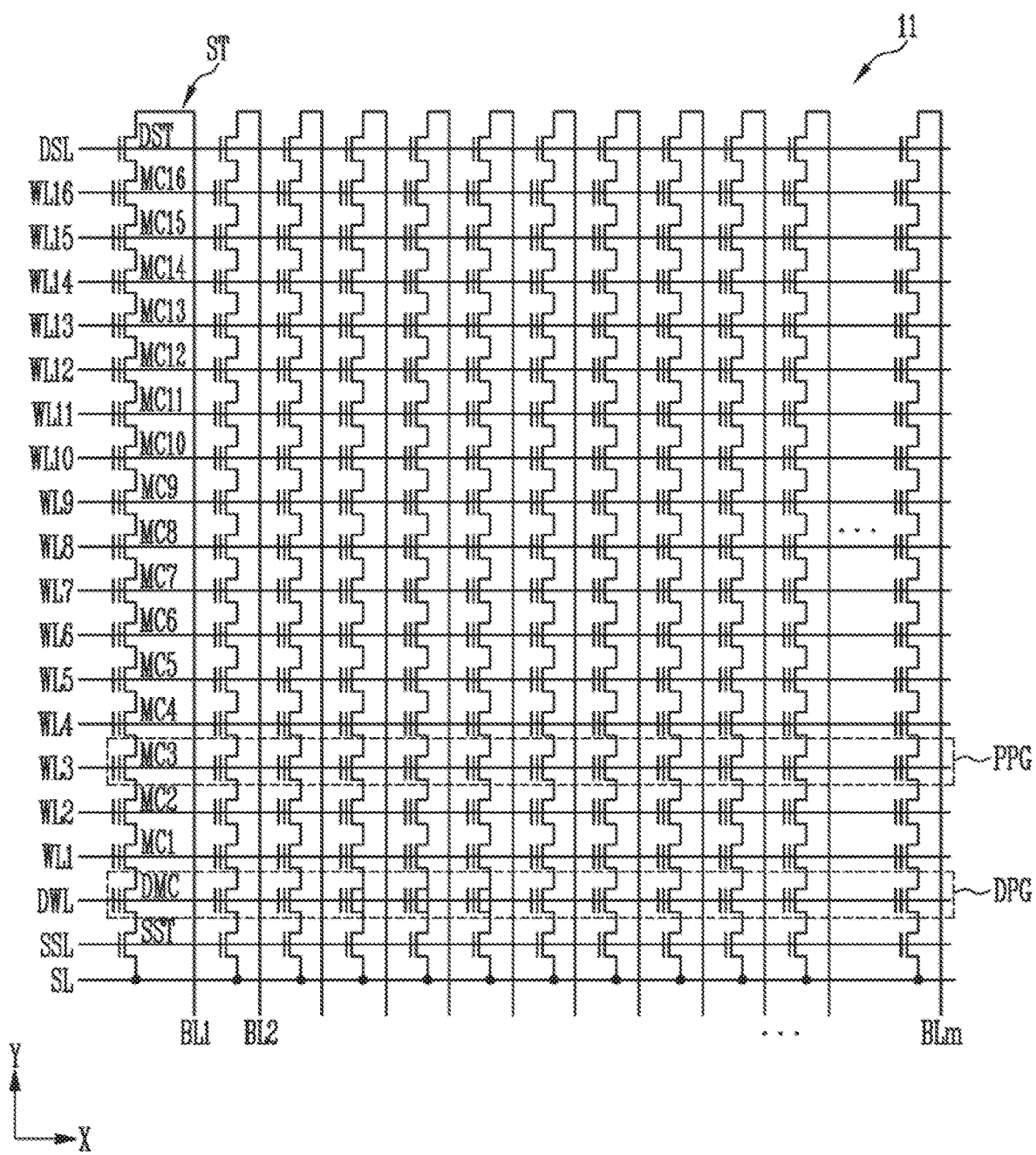
FIG. 4 is a diagram illustrating a memory block shown in FIG. 3.

FIG. 4 is a diagram illustrating the memory block shown in FIG. 3.

Referring to FIG. 4, in the memory block 11, a plurality of word lines WL1 to WL16 arranged in parallel to one another may be coupled between a first select line and a second select line. The first select line may be a source select line SSL, and the second select line may be a drain select line DSL. In addition, a dummy word line DWL is disposed between the first select line and a first word line WL1. For example, the memory block 11 may include a plurality of strings ST coupled between bit lines BL1 to BLm and a source line SL. The bit lines BL1 to BLm may be coupled to the strings ST, respectively, and the source line SL may be commonly coupled to the strings ST. The strings ST may be configured identically to one another, and therefore, a string ST coupled to a first bit line BL1 will be described as an example.

The string ST may include a source select transistor SST, a dummy memory cell DMC, a plurality of memory cells MC1 to MC16, and a drain select transistor DST, which are coupled in series between the source line and the first bit line BL1. At least one source select transistor SST and at least one drain select transistor DST may be included in one string ST, and memory cells of which number is greater than that of the memory cells MC1 to MC16 shown in the drawing may be included in one string ST.

A source of the source select transistor SST may be coupled to the source line SL, and a drain of the drain select transistor DST may be coupled to the first bit line BL1. The dummy memory cell DMC may be coupled between the source select transistor SST and the memory cell MC1, and the memory cells MC1 to MC16 may be coupled in series between the dummy memory cell DMC and the drain select transistor DST. Gates of source select transistors SST included in different strings ST may be coupled to the source select line SSL, gates of drain select transistors DST included in different strings ST may be coupled to the drain select line DSL, and gates of the dummy memory cells DMC included in different strings ST may be coupled to the dummy word line DWL. Gates of the memory cells MC1 to MC16 included in different strings ST may be coupled to the plurality of word lines WL1 to WL16. A group of memory cells coupled to the same word line among the memory cells included in different strings ST may be referred as a physical page PPG. Therefore, physical pages PPG of which number corresponds to that of the word lines WL1 to WL16 may be included in the memory block 11. In addition, a group of dummy memory cells DMC coupled to the dummy word line DWL may be referred as a dummy page DPG, and first to nth physical pages PPG corresponding to the respective word lines WL1 to WL16 may be defined as main pages.

A memory cell in which data of one bit is stored may be referred to as a single level cell (SLC), and therefore, one physical page PPG may store one logical page (LPG) data. A memory cell in which data of two bits is stored may be referred to as a multi-level cell (MLC), and therefore, one physical page PPG may store two LPG data. A memory cell in which data of three bits is stored may be referred to as a triple level cell (TLC), and therefore, one physical page PPG may store three LPG data. A memory cell in which data of four bits is stored may be referred to as a quadruple level cell (QLC), and therefore, one physical page PPG may store four LPG data.

In an embodiment, program and read operations using an SLC scheme may be performed on the dummy page included in each of the memory blocks MB1 to MBk shown in FIG. 3, and program and read operations using an MLC scheme may be performed on the main pages included in each of the memory blocks MB1 to MBk shown in FIG. 3.

Figure 5:
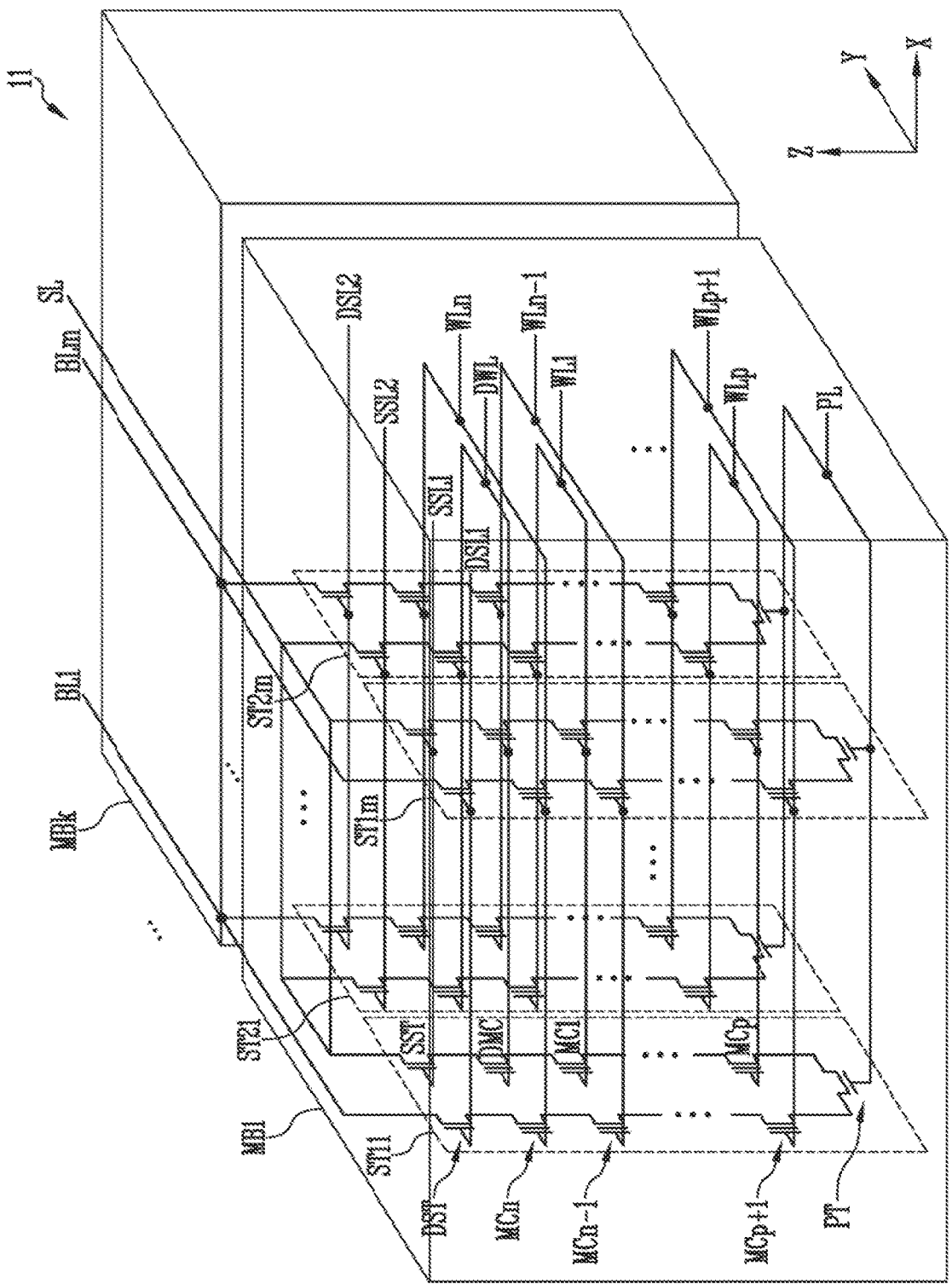
FIG. 5 is a diagram illustrating an embodiment of a three-dimensionally configured memory block.

FIG. 5 is a diagram illustrating an embodiment of a three-dimensionally configured memory block.

Referring to FIG. 5, the memory cell array 10 may include memory blocks MB1 to MBk 11. The memory block 11 may include a plurality of strings ST11 to ST1m and ST21 to ST2m. In an embodiment, each of the plurality of strings ST11 to ST1m and ST21 to ST2m may be formed in a 'U' shape. In the memory block 11, m strings may be arranged in a row direction (X direction). Although a case where two strings are arranged in a column direction (Y direction) is illustrated in FIG. 5, this is for convenience of description, and three or more strings may be arranged in the column direction (Y direction).

Each of the plurality of strings ST11 to ST1m and ST21 to ST2m may include at least one source select transistor SST, at least one dummy memory cell DMC, first to nth memory cells MC1 to MCn, a pipe transistor PT, and at least one drain select transistor DST.

The source and drain select transistors SST and DST, the dummy memory cell DMC, and the memory cells MC1 to MCn may have structures similar to one another. For example, each of the source and drain select transistors SST and DST, the dummy memory cell DMC, and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and the dummy memory cell DMC.

In an embodiment, source select transistors of strings arranged in the same row may be coupled to a source select line extending in the row direction, and source select transistors of strings arranged in different rows may be coupled to different source select lines. In FIG. 5, source select transistors of strings ST11 to ST1m of a first row may be coupled to a first source select line SSL1. Source select transistors of strings ST21 to ST2m of a second row may be coupled to a second source select line SSL2.

In another embodiment, the source select transistors of the strings ST11 to ST1m and ST21 to ST2m may be commonly coupled to one source select line.

The dummy memory cell DMC of each string may be coupled between the source select transistor SST and the first memory cell MC1. A gate of the dummy memory cell DMC may be coupled to a dummy word line DWL.

The first to nth memory cells MC1 to MCn of each string may be coupled between the dummy memory cell DMC and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be coupled in series to each other between the source select transistor SST and the pipe transistor PT. The (p+1)th to nth memory cells MCp+1 to MCn may be sequentially arranged in the vertical direction (Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1, of the first row may be coupled to a first drain select line DSL1. Drain select transistors of the strings ST21 to ST2m of the second row may be coupled to a second drain select line DSL2.

Strings arranged in the column direction may be coupled to bit lines extending in the column direction. In FIG. 5, strings ST11 and ST21 of a first column may be coupled to a first bit line BL1. Strings ST1m and ST2m of an mth column may be coupled to an mth bit line BLm.

Memory cells coupled to the same word line among the strings arranged in the row direction may constitute one physical page. For example, memory cells coupled to the first word line WL1 among the strings ST11 to ST1m of the first row may constitute one physical page. Memory cells coupled to the first word line WL1 among the strings ST21 to ST2m of the second row may constitute another physical page. When any one of the drain select lines DSL1 and DSL2 is selected, strings arranged in one row direction may be selected. When any one of the word lines WL1 to WLn is selected, one page among the selected strings may be selected.

Figure 6:
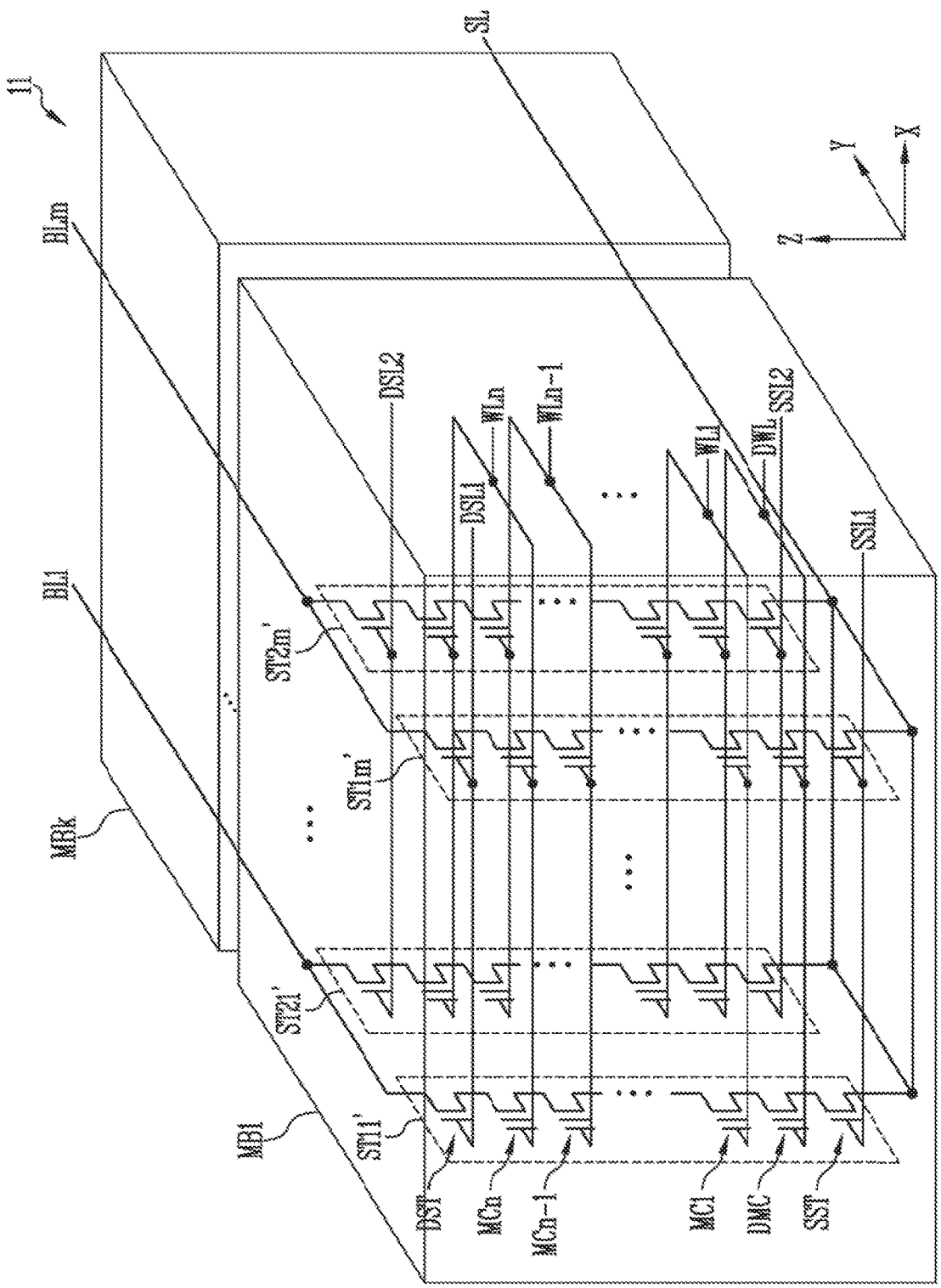
FIG. 6 is a diagram illustrating another embodiment of the three-dimensionally configured memory block.

FIG. 6 is a diagram illustrating another embodiment of the three-dimensionally configured memory block.

Referring to FIG. 6, the memory cell array 10 may include a plurality of memory blocks MB1 to MBk 11. The memory block 11 may include a plurality of strings ST11' to ST1m' and ST21' to ST2m'. Each of the plurality of strings ST11' to ST1m' and ST21' to ST2m' may extend along a vertical direction (Z direction). In the memory block 11, m strings may be arranged in a row direction (X direction). Although a case where two strings are arranged in a column direction (Y direction) is illustrated in FIG. 6, this is for convenience of description, and three or more strings may be arranged in the column direction (Y direction).

Each of the plurality of strings ST11' to ST1m' and ST21' to ST2m' may include at least one source select transistor SST, a dummy memory cell DMC, first to nth memory cells MC1 to MCn, and at least one drain select transistor DST.

The source select transistor SST of each string may be coupled between a source line SL and the dummy memory cell DMC. Source select transistors of strings arranged in the same row may be coupled to the same source select line. Source select transistors of strings ST11' to ST1m' arranged on a first row may be coupled to a first source select line SSL1. Source select transistors of strings ST21' to ST2m' arranged on a second row may be coupled to a second source select line 55L2. In another embodiment, the source select transistors of the strings ST11' to ST1m' and ST21' to ST2m' may be commonly coupled to one source select line.

The dummy memory cell DMC of each string may be coupled between the source select transistor SST and the first memory cell MC1. A gate of the dummy memory cell DMC may be coupled to a dummy word line DWL.

The first to nth memory cells MC1 to MCn of each string may be coupled in series between the dummy memory cell DMC and the drain select transistor DST. Gates of the first to nth memory cells MC1 to MCn may be coupled to first to nth word lines WL1 to WLn, respectively.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

Figure 7:
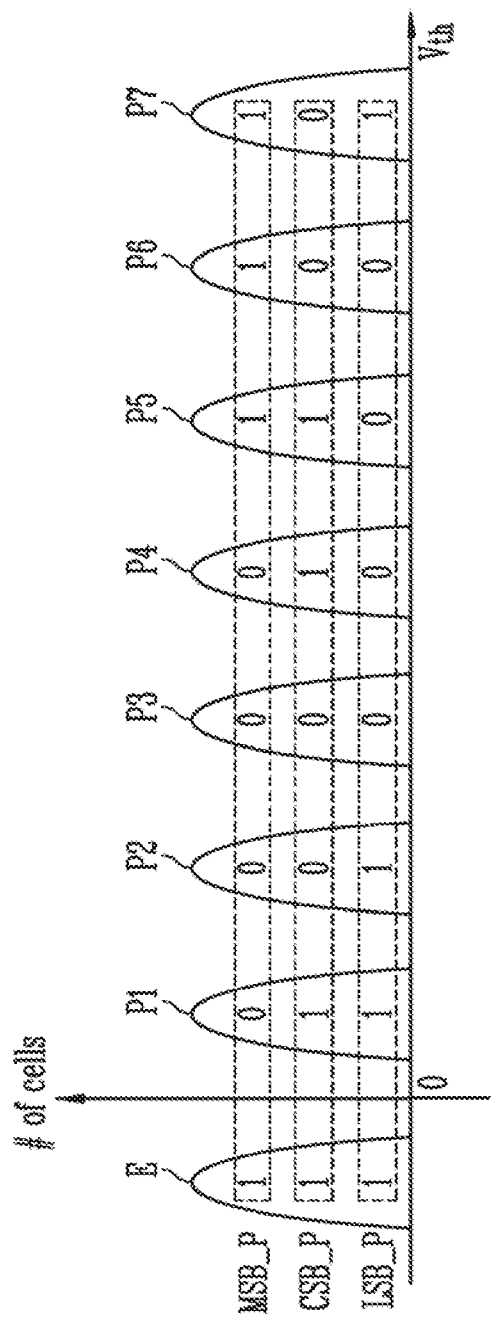
FIG. 7 is a threshold voltage distribution diagram illustrating threshold voltage distributions of memory cells.

FIG. 7 is a threshold voltage distribution diagram illustrating threshold voltage distributions of memory cells.

In an embodiment of the present disclosure, threshold voltage distributions of memory cells programmed using a TLC scheme will be described as an example.

Referring to FIG. 7, a plurality of memory cells may be programmed to an erase state E and first to seventh program states P1 to P7, to each store data including Most Significant Bit (MSB) data, Central Significant Bit (CSB), and Least Significant Bit (LSB) data.

Memory cells coupled to one word line may be defined as one physical page PPG shown in FIG. 4. Memory cells included in one physical page PPG may store first to third logical page (LPG) data. For example, the first LPG data may be data stored in a LSB page LSB_P, the second LPG data may be data stored in a CSB page CSB_P, and the third LPG data may be data stored in a MSB page MSB_P.

Figure 8:
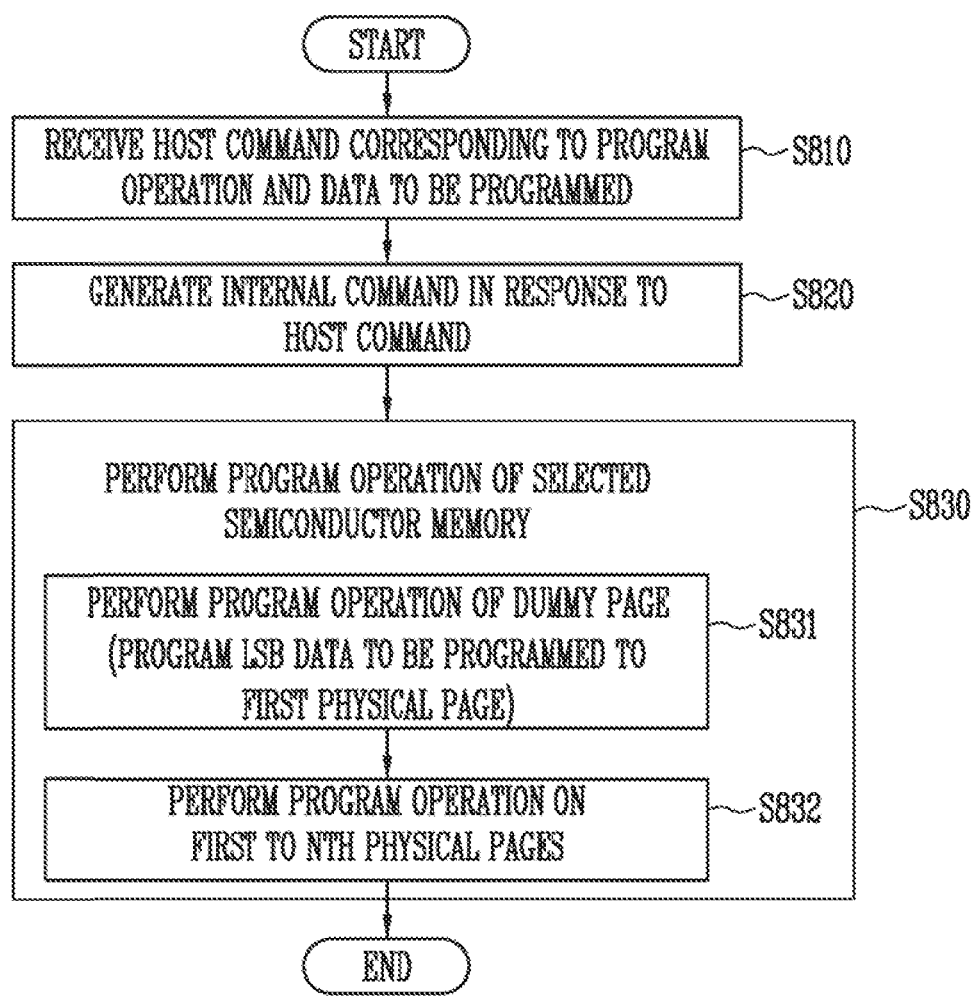
FIG. 8 is a flowchart illustrating a program operation method of the memory system in accordance with an embodiment of the present disclosure.

FIG. 8 is a flowchart illustrating a program operation method of the memory system in accordance with an embodiment of the present disclosure.

The program operation method of the memory system in accordance with an embodiment of the present disclosure will be described as follows with reference to FIGS. 1 to 8. In an embodiment of the present disclosure, a program operation of programming a selected memory block (e.g., MB1) by using the TLC scheme will be described as an example.

The controller 1200 receives a host command Host_CMD corresponding to a program operation and data to be programmed from the host 1300 (S810). The controller 1200 may receive a logical address together with the host command Host_CMD. The host control circuit 1210 of the controller 1200 buffers the data input from the host 1300 to the buffer memory 1230, and transmits the host command Host_CMD and the logical address, which are received from the host 1300, to the processor 1220.

The processor 1220 generates a command queue corresponding to the program operation by parsing the received host command Host_CMD, and maps the logical address to a physical address corresponding to the memory device 1100.

The flash control circuit 1250 generates and outputs an internal command CMD for controlling the memory device 1100 in response to the command queue generated by the processor 1220 (S820). The internal command CMD may be transmitted together with data DATA to be programmed, which is stored in the buffer memory 1230, and an address ADDR mapped to the physical address to the memory device 1100.

A selected semiconductor memory 100 of the memory device 1100 performs the program operation in response to the internal command CMD received from the controller 1200 (S830).

The program operation (S830) of the selected semiconductor memory 100 will be described as follows.

In the program operation of the semiconductor memory 100, a program operation (S831) of a dummy page DPG and a program operation (S832) of main pages PPG are sequentially performed in response to the internal command CMD.

In the program operation (S831) of the dummy page DPG, the semiconductor memory 100 programs, to the dummy page DPG, the same data as first logical page data to be programmed to a first main page most adjacent to the dummy page DPG among the main pages PPG, i.e., a first physical page including memory cells MC1 coupled to a first word line WL1. The program operation of the dummy page DPG may be defined as a dummy program operation. The dummy program operation may be performed using an SLC program scheme.

The control logic 300 controls the peripheral circuits 200 to perform the dummy program operation in response to an internal command CMD and data DATA to be programmed, which are received from the controller 1200. The page buffer group 230 receives and temporarily stores the first logical page data (LSB data) to be programmed to the first main page, i.e., the first physical page including the memory cells MC1 coupled to the first word line WL1, and controls potential levels of bit lines BL1 to BLm according to the temporarily stored data.

The voltage generating circuit 210 generates and outputs a program voltage and a pass voltage in response to an operation signal OP_CMD, and the row decoder 220 performs the program operation of the dummy page by applying the program voltage generated by the voltage generating circuit 210 to a dummy word line DWL of the selected memory block (e.g., MB1) and applying the pass voltage generated by the voltage generating circuit 210 to word lines WL1 to WLn in response to control signals AD_signals.

After the dummy program operation is ended, the program operation (S832) of the main pages PPG is performed. The program operation (S832) of the main pages PPG may be defined as a normal program operation. The normal program operation may be performed using a TLC program scheme.

The control logic 300 controls the peripheral circuits 200 to perform the normal program operation in response to the internal command CMD and the data DATA to be programmed, which are received from the controller 1200. The page buffer group 230 receives and temporarily stores the first logical page data (LSB data) to be programmed to the first main page, i.e., the first physical page including the memory cells MC1 coupled to the first word line WL1, and controls the potential levels of the bit lines BL1 to BLm according to the temporarily stored data.

The voltage generating circuit 210 generates and outputs a program voltage and a pass voltage in response to the operation signal OP_CMD, and the row decoder 220 performs the program operation of the dummy page by applying the program voltage generated by the voltage generating circuit 210 to the first word line WL1 of the selected memory block (e.g., MB1) and applying the pass voltage generated by the voltage generating circuit 210 to the dummy word line DWL and the other word lines WL2 to WLn in response to the control signals AD_signals.

Subsequently, the page buffer group 230 receives and temporarily stores second logical page data (CBS data), and controls the potential levels of the bit lines BL1 to BLm.

The voltage generating circuit 210 generates and outputs a program voltage and a pass voltage in response to the operation signal OP_CMD, and the row decoder 220 performs a CBS data program operation on the first main page by applying the program voltage generated by the voltage generating circuit 210 to the first word line WL1 of the selected memory block (e.g., MB1) and applying the pass voltage generated by the voltage generating circuit 210 to the dummy word line DWL and the other word lines WL2 to WLn in response to the control signals AD_signals.

Subsequently, the page buffer group 230 receives and temporarily stores third logical page data (MSB data), and controls the potential levels of the bit lines BL1 to BLm according to the temporarily stored data.

The voltage generating circuit 210 generates and outputs a program voltage and a pass voltage in response to the operation signal OP_CDM, and the row decoder 220 performs an MSB data program operation on the first physical page by applying the program voltage generated by the voltage generating circuit 210 to the first word line WL1 of the selected memory block (e.g., MB1) and applying the pass voltage generated by the voltage generating circuit 210 to the dummy word line DWL and the other word lines WL2 to WLn in response to the control signals AD_signals.

Subsequently, the control logic 300 controls the peripheral circuits 200 to perform an LSB data program operation, a CSB data program operation, and an MSB data program operation on a next main page, i.e., a second physical page including memory cells MC2 coupled to a second word line WL2. The other main pages PPG are sequentially programmed in the above-described manner.

In accordance with the above-described embodiment of the present disclosure, the first logical page data programmed to the first physical page is programmed to the dummy page included in the selected memory block.

Figure 9:
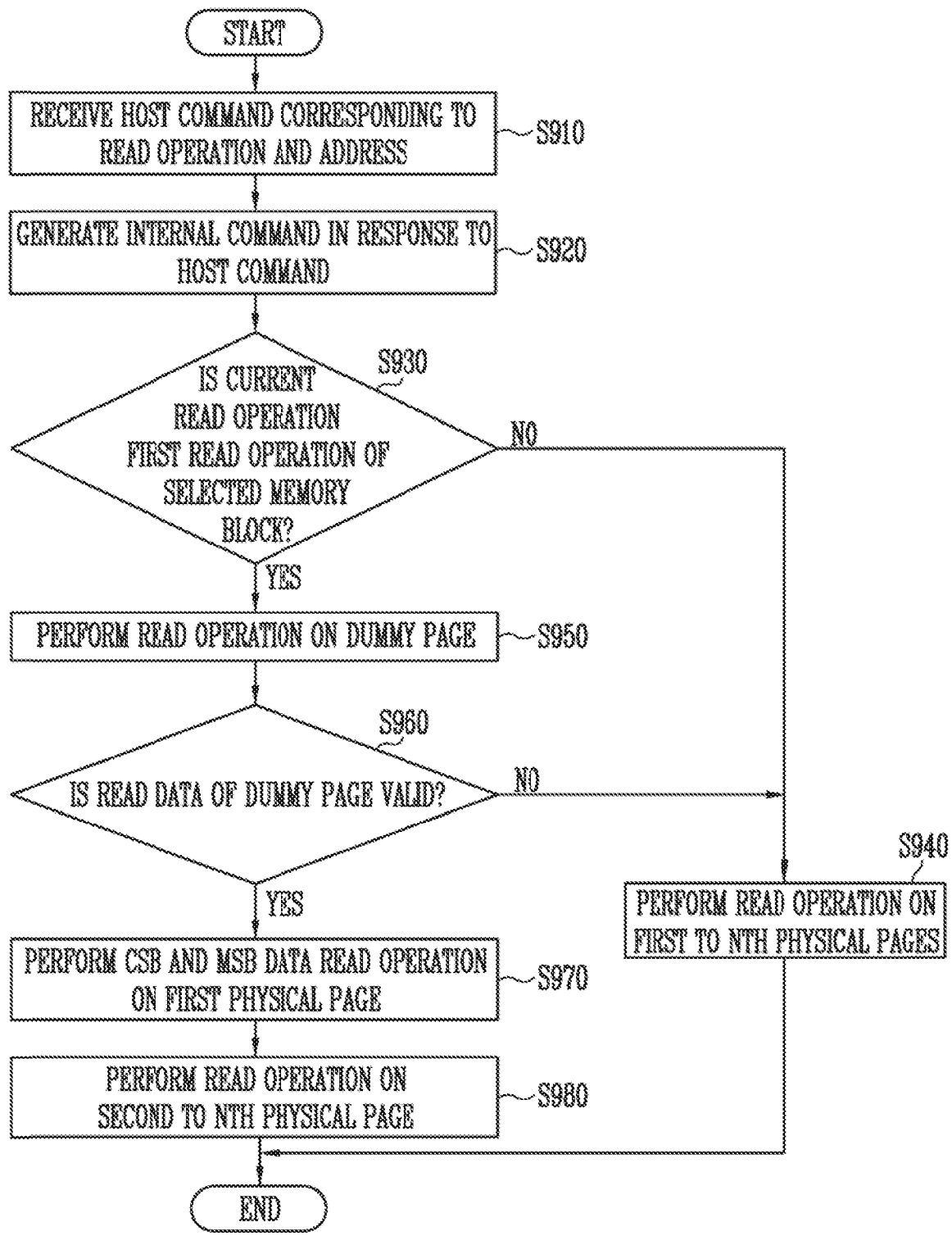
FIG. 9 is a flowchart illustrating a read operation method of the memory system in accordance with an embodiment of the present disclosure.

FIG. 9 is a flowchart illustrating a read operation method of the memory system in accordance with an embodiment of the present disclosure.

The read operation method of the memory system in accordance with an embodiment of the present disclosure will be described as follows with reference to FIGS. 1 to 7 and 9.

In an embodiment of the present disclosure, a read operation of a memory block (e.g., MB1) including main pages PPG programmed using the TLC program scheme and a dummy page DPG to which first logical data (LSB data) of a first main page is programmed using the SLC program scheme as described with reference to FIG. 8 will be described as an example.

The controller 1200 receives a host command Host_CMD corresponding to a read operation and a logical address from the host 1300 (S910). The host control circuit 1210 of the controller 1200 transmits the host command Host_CMD and the logical address, which are received from the host 1300, to the processor 1220.

The processor 1220 generates a command queue corresponding to the read operation by parsing the received host command Host_CMD, and maps the logical address to a physical address corresponding to the memory device 1100. The processor 1220 checks whether a read operation has been performed on a memory block (e.g., MB1) corresponding to the mapped physical address after a program operation is completed, and determines whether a read operation on the dummy page of the selected memory block MB1 is to be performed according to whether the read operation has been performed. For example, when there is no history where a read operation on the selected memory block MB1 has been performed after the program operation is completed, the processor 1220 generates a command queue to perform a dummy read operation on the dummy page of the selected memory block MB1 in the read operation. On the other hand, when there is a history where a read operation on the selected memory block MB1 has been performed after the program operation is completed, the processor 1220 generates a command queue to perform a normal read operation on the main pages on the selected memory block MB1.

The flash control circuit 1250 generates an internal command CMD for controlling the memory device 1100 in response to the command queue generated by the processor 1220 (S920). The internal command CMD may be transmitted together with an address ADDR mapped to the physical address to the memory device 1100.

A selected semiconductor memory 100 of the memory device 1100 performs a read operation in response to the internal command CMD received from the controller 1200 and the mapped address ADDR.

The controller 300 determines whether a current read operation of the selected memory block MB1 is a first read operation, in response to the internal command CMD received from the controller 1200 (S930).

When it is determined in the above-described determination step (S930) that the current read operation is not the first read operation of the selected memory block MB1 (No), the semiconductor memory 1000 performs the read operation on the main pages (first to nth physical pages) in response to the received internal command (S940).

For example, the control logic 300 controls the peripheral circuits 200 to perform the read operation in response to the internal command CMD received from the controller. The voltage generating circuit 210 generates and outputs a read voltage and a pass voltage, which correspond to LSB data, in response to an operation signal OP_CMD. The row decoder 220 applies the read voltage generated by the voltage generating circuit 210 to a first word line WL1 of the selected memory block (e.g., MB1) and applies the pass voltage generated by the voltage generating circuit 210 to a dummy word line DWL and the other word lines WL2 to WLn, in response to control signals AD_signals. The page buffer group 230 performs an LSB data read operation by sensing potential levels or current amounts of bit lines BL1 to BLm and sensing the LSB data stored in a first physical page.

Subsequently, the voltage generating circuit 210 generates and outputs a read voltage and a pass voltage, which correspond to CSB data, in response to the operation signal OP_CMD. The row decoder 220 applies the read voltage generated by the voltage generating circuit 210 to the first word line WL1 of the selected memory block (e.g., MB1) and applies the pass voltage generated by the voltage generating circuit 210 to the dummy word line DWL and the other word lines WL2 to WLn, in response to the control signals AD_signals. The page buffer group 230 performs a CSB data read operation by sensing potential levels or current amounts of the bit lines BL1 to BLm and sensing the CSB data stored in the first physical page.

Subsequently, the voltage generating circuit 210 generates and outputs a read voltage and a pass voltage, which correspond to MSB data, in response to the operation signal OP_CMD. The row decoder 220 applies the read voltage generated by the voltage generating circuit 210 to the first word line WL1 of the selected memory block (e.g., MB1) and applies the pass voltage generated by the voltage generating circuit 210 to the dummy word line DWL and the other word lines WL2 to WLn, in response to the control signals AD_signals. The page buffer group 230 performs an MSB data read operation by sensing potential levels or current amounts of the bit lines BL1 to BLm and sensing the MSB data stored in the first physical page.

Subsequently, the control logic 300 controls the peripheral circuits 200 to perform an LSB data read operation, a CSB data read operation, and an MSB data read operation on a next main page, i.e., a second physical page including memory cells MC2 coupled to a second word line WL2. The other main pages PPG are sequentially read in the above-described manner.

When it is determined in the above-described determination step (S930) that the current read operation is the first read operation of the selected memory block MB1 (Yes), the semiconductor memory 100 perform a read operation on the dummy page DPG in response to the received internal command CMD (S950). A channel of the selected memory block MB1, which is selected by a channel precharge operation and a discharge operation during the read operation of the dummy page DPG, can have a stable potential level.

Data read in the read operation of the dummy page DPG is transmitted to the controller 1200, and the error correction circuit 1240 of the controller 1200 performs a validity determination operation (S960) of determining whether the received data is valid. For example, the error correction circuit 1240 may detect and count a number of error bits included in the received data, determine that the corresponding data is valid when the counted number of error bits is equal to or smaller than a maximum allow error bit number of the error correction circuit 1240, and determine that the corresponding data is not valid when the counted number of error bits is greater than a maximum allow error bit number of the error correction circuit 1240.

When it is determined in the above-described validity determination step (S960) that the read data is not valid (No), the processor 1220 generates a command queue to perform the above-described read operation performance step (S940) of the first to nth physical pages, and the flash control circuit 1250 generates an internal command CMD in response to the command queue. The selected semiconductor memory 100 of the memory device 1100 performs the above-described read operation on the first to nth physical page in response to the internal command CMD.

When it is determined in the above-described validity determination step (S960) that the read data is valid (Yes), an error correction operation on the read data of the dummy page DPG is performed by the error correction circuit 1240, and the read data of the dummy page DPG is then stored in the read buffer 1232. The processor 1220 generates a command queue to read CSB data and MSB data of the first physical page. The data of the dummy page DPG is used as LSB data of the first physical page. The flash control circuit 1250 generates an internal command CMD in response to the command queue. The selected semiconductor memory 100 of the memory device 1100 performs a CSB data read operation and an MSB data read operation of the first physical page in response to the internal command CMD (S970).

The CSB data and the MSB data of the first physical page, which are read by the semiconductor memory 100, are transmitted to the controller 1200, and are stored in the rad buffer 1232 of the buffer memory 1230 after the error correction operation is performed by the error correction circuit 1240.

The processor 1220 generates a command queue to read LSB data, CSB data, and MSB data, which are stored in the second to nth physical pages. The flash control circuit 1250 generates an internal command CMD in response to the command queue. The selected semiconductor memory 100 of the memory device 1100 sequentially performs a read operation on the second to nth physical pages in response to the internal command CMD (S980).

The read LSB, CSB, and MSB data of the second to nth physical pages are stored in the read buffer 1232 of the buffer memory 1230 after the error correction operation is performed by the error correction circuit 1240, and the read buffer 1232 outputs the buffered data to the host 1300 through the host control circuit 1210.

In accordance with the above-described embodiment of the present disclosure, the potential level of the channel is set to a stable level by performing the read operation of the dummy page in the first read operation of the selected memory block, so that the read reliability of the main pages can be improved.

Figure 10:
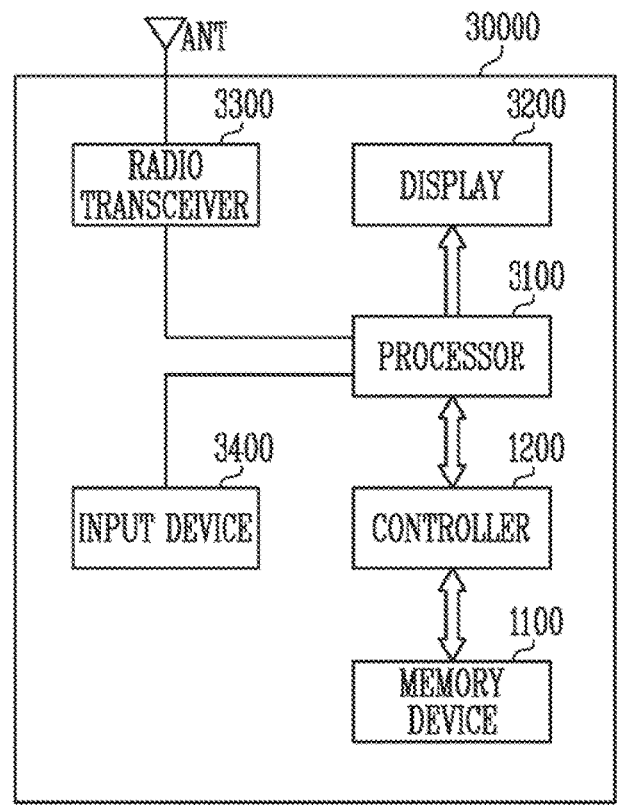
FIG. 10 is a diagram illustrating another embodiment of the memory system.

FIG. 10 is a diagram illustrating another embodiment of the memory system.

Referring to FIG. 10, the memory system 30000 may be implemented as a cellular phone, a smart phone, a tablet PC, a personal digital assistant (PDA), or a wireless communication device. The memory system 30000 may include the memory device 1100 and the controller 1200 capable of controlling an operation of the memory device 1100. The controller 1200 may control a data access operation of the memory device 1100, e.g., a program operation, an erase operation, a read operation, or the like under the control of a processor 3100.

Data programmed in the memory device 1100 may be output through a display 3200 under the control of the controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 1200 or the display 3200. The controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the controller 1200, data output from the radio transceiver 3300, or data output from the input device 3400 can be output through the display 3200.

In some embodiments, the controller 1200 capable of controlling an operation of the memory device 1100 may be implemented as a part of the processor 3100, or be implemented as a chip separate from the processor 3100. Also, the controller 1200 may be implemented with the controller shown in FIG. 2. Also, the memory device 1100 may include the semiconductor memories 100 illustrated in FIG. 1.

Figure 11:
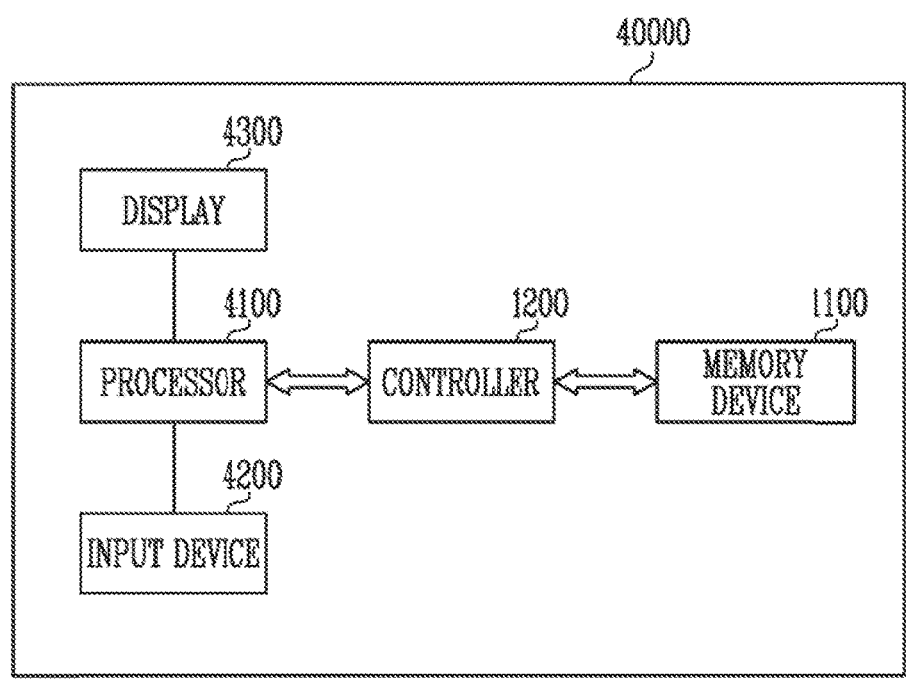
FIG. 11 is a diagram illustrating another embodiment of the memory system.

FIG. 11 is a diagram illustrating another embodiment of the memory system.

Referring to FIG. 11, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include the memory device 1100 and the controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the controller 1200. In some embodiments, the controller 1200 capable of controlling an operation of the memory device 1100 may be implemented as a part of the processor 4100, or be implemented as a chip separate from the processor 4100. Also, the controller 1200 may be implemented with the controller shown in FIG. 2. Also, the memory device 1100 may include the semiconductor memories 100 illustrated in FIG. 1.

Figure 12:
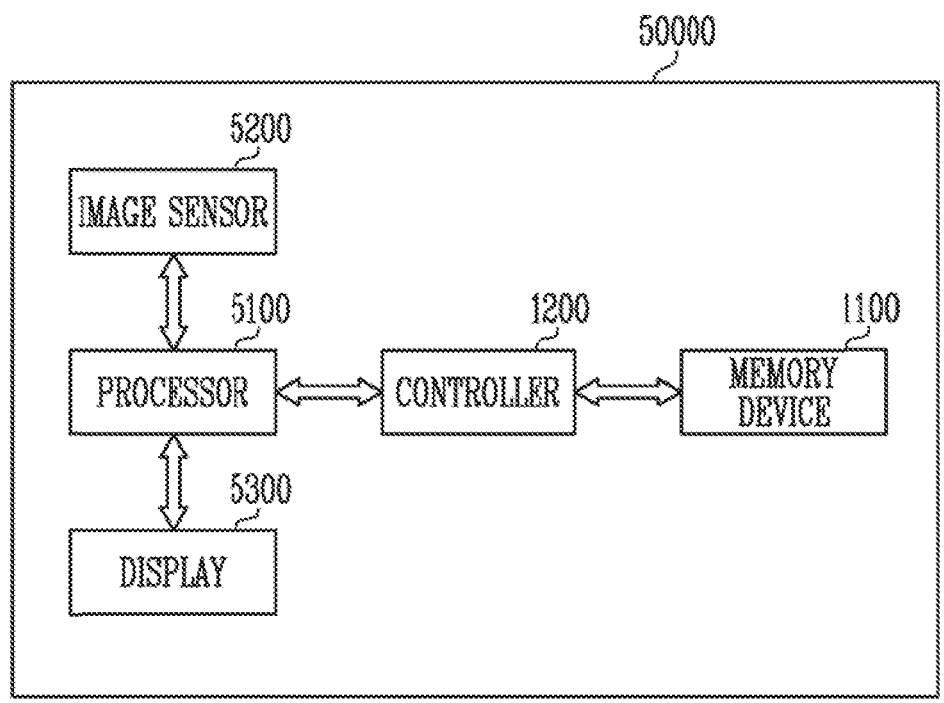
FIG. 12 is a diagram illustrating another embodiment of the memory system.

FIG. 12 is a diagram illustrating another embodiment of the memory system.

Referring to FIG. 12, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include the memory device 1100 and the controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the controller 1200. Under the control of the processor 5100, the converted digital signals may be output through a display 5300, or be stored in the memory device 1100 through the controller 1200. In addition, data stored in the memory device 1100 may be output through the display 5300 under the control of the processor 5100 or the controller 1200.

In some embodiments, the controller 1200 capable of controlling an operation of the memory device 1100 may be implemented as a part of the processor 5100, or be implemented as a chip separate from the processor 5100. Also, the controller 1200 may be implemented with the controller shown in FIG. 2. Also, the memory device 1100 may include the semiconductor memories 100 illustrated in FIG. 1.

Figure 13:
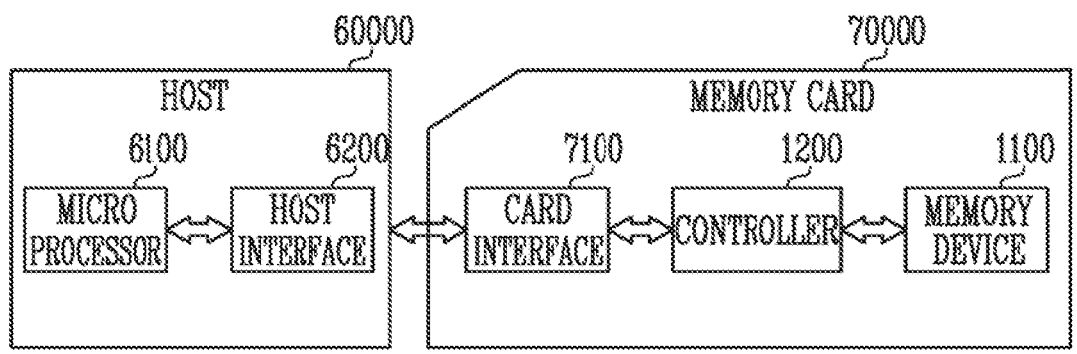
FIG. 13 is a diagram illustrating another embodiment of the memory system.

FIG. 13 is a diagram illustrating another embodiment of the memory system.

Referring to FIG. 13, the memory system 70000 may be implemented as a memory card or a smart card. The memory system 70000 may include the memory device 1100, the controller 1200, and a card interface 7100.

The controller 1200 may control data exchange between the memory device 1100 and the card interface 7100. In some embodiments, the card interface 7100 may be a secure digital (SD) card interface or a multi-media card (MMC) interface, but the present disclosure is not limited thereto. Also, the controller 1200 may be implemented with the controller shown in FIG. 2. Also, the memory device 1100 may include the semiconductor memories 100 illustrated in FIG. 1.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor 6100.

In accordance with the present disclosure, the potential level of a channel of a memory block is stabilized by performing a read operation on a dummy page in a first read operation of the memory block, and a read operation on main pages is then performed, so that the read reliability of the memory device can be improved.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
    a memory block including a plurality of main pages and a dummy page;
    a peripheral circuit configured to perform a normal program operation on the plurality of main pages and a dummy program operation on the dummy page in a program operation, and read data stored in the dummy page and the plurality of main pages in a read operation; and
    control logic configured to control the peripheral circuit to program, to the dummy page, the same data as first logical page data of a first main page among the plurality of main pages in the program operation,
    wherein the first main page is most adjacent to the dummy page among the plurality of main pages, and
    wherein, when the read operation is a first read operation of the memory block, the control logic controls the peripheral circuit to read the data stored in the dummy page, determine whether read data is valid by comparing a number of error bits included in the read data with a maximum allow error bit number, and read the data stored in the plurality of main pages according to whether the read data is valid.

2. The memory device of claim 1, wherein, in the normal program operation, the peripheral circuit programs the first logical page data to each of the plurality of main pages and then sequentially programs second logical page data and third logical page data, and
    wherein the first logical page data is Least Significant Bit (LSB) data, the second logical page data is Central Significant Bit (CSB) data, and the third logical page data is a Most Significant Bit (MSB) data.

3. The memory device of claim 2, wherein, when the data read from the dummy page is valid, the control logic controls the peripheral circuit to perform a read operation on the second logical page data and the third logical page data of the first main page among the plurality of main pages, and perform a read operation on the first to third logical page data of each of the other main pages.

4. The memory device of claim 3, wherein, when the data read from the dummy page is not valid, the control logic controls the peripheral circuit to perform a read operation on the first to third logical page data of each of the plurality of main pages.

5. The memory device of claim 2, wherein, when the read operation is not the first read operation of the memory block, the control logic controls the peripheral circuit to skip a read operation on the dummy page, and perform a read operation on the first logical page data to the third logical page data of each of the plurality of main pages.

6. The memory device of claim 1, wherein the peripheral circuit programs the dummy page by using a single level cell (SLC) scheme in the dummy program operation.

7. A memory system comprising:
   a memory device configured to include a plurality of memory blocks each including a plurality of main pages and a dummy page and a peripheral circuit for a program operation and a read operation on a selected memory block among the plurality of memory blocks; and
   a controller configured to control the memory device to perform the program operation and the read operation in response to a request received from a host, and control the memory device to perform a dummy read operation on the dummy page and a normal read operation on the plurality of main pages in a first read operation of the selected memory block,
   wherein, in the program operation, the memory device programs, to the dummy page, first logical page data to be programmed to a first main page among the main pages, and programs the first logical page data, second logical page data, and third logical page data to the main pages,
   wherein the first main page is most adjacent to the dummy page among the plurality of main pages included in a memory block, and
   wherein the controller controls the memory device to read data stored in the dummy page in the first read operation of the selected memory block, receives the data of the dummy page from the memory device, and determines whether the received data of the dummy page is valid by comparing a number of error bits included in the data of the dummy page with a maximum allow error bit number.

8. The memory system of claim 7, wherein, when it is determined that the data of the dummy page is valid, the controller controls the memory device to perform a read operation on the second logical page data and the third logical page data of the first main page and a read operation on the first logical page data to the third logical page data of each of the other main pages.

9. The memory system of claim 7, wherein, when it is determined that the data of the dummy page is not valid, the controller controls the peripheral circuit to skip a read operation on the dummy page, and perform a read operation on the first logical page data to the third logical page data of each of the main pages.

10. The memory system of claim 7, wherein the controller includes an error correction circuit,
    wherein the error correction circuit compares the number of error bits included in the data of the dummy page with the maximum allow error bit number of the error correction circuit, determines that the data of the dummy page is valid when the number of error bits is smaller than or equal to the maximum allow error bit number, and determines that the data of the dummy page is not valid when the number of error bits is greater than the maximum allow error bit.

11. The memory system of claim 7, wherein the memory device programs, to the dummy page, the first logical page data to be programmed to the first main page among the main pages by using a single level cell (SLC) scheme.

12. A method for operating a memory system, the method comprising:
    providing a memory block including a plurality of main pages and a dummy page;
    performing a dummy program operation of programming, to the dummy page, first logical page data to be programmed to a first main page among the plurality of main pages;
    performing a normal program operation of programming the first logical page data to nth logical page data (n is a positive number of 2 or more) to each of the plurality of main pages;
    reading data stored in the dummy page, when a first read operation of the memory block is requested;
    determining whether the read data is valid by comparing a number of error bits included in the data of the dummy page with a maximum allow error bit number; and
    when it is determined that the read data is valid, performing a read operation on the second logical page data to the nth logical page data of the first main page, and performing a read operation on the first logical page data to the nth logical page data of each of the other main pages except the first main page,
    wherein the first main page is most adjacent to the dummy page among the plurality of main pages.

13. The method of claim 12, wherein, in the dummy program operation, the first logical page data is programmed to the dummy page by using a single level cell (SLC) scheme.

14. The method of claim 12, wherein, when it is determined the read data is valid, the read data is used as the first logical page data of the first main page.

15. The method of claim 12, comprising, when it is determined the read data is not valid, performing a read operation on the first logical page data to the third logical page data of each of the plurality of main pages.

* * * * *